United States Patent [19]

Levinstein et al.

[11] 4,256,534
[45] Mar. 17, 1981

[54] DEVICE FABRICATION BY PLASMA ETCHING

[75] Inventors: Hyman J. Levinstein, Berkeley Heights; David N. Wang, Warren Township, Somerset County, both of N.J.

[73] Assignee: Bell Telephone Laboratories, Incorporated, Murray Hill, N.J.

[21] Appl. No.: 929,567

[22] Filed: Jul. 31, 1978

[51] Int. Cl.³ ............................. C23F 1/00; C23F 1/02
[52] U.S. Cl. .................................... 156/643; 156/646; 156/656; 156/657; 156/665; 204/192 E; 252/79.1

[58] Field of Search ............... 156/643, 646, 656, 657, 156/659, 662, 665, 666; 204/164, 192 EC, 298, 192 E; 252/79.1

[56] References Cited

U.S. PATENT DOCUMENTS

| | | | |
|---|---|---|---|
| 3,615,956 | 10/1971 | Irving et al. | 156/646 X |
| 3,994,793 | 11/1976 | Harvilchuck et al. | 156/646 X |
| 4,030,967 | 6/1977 | Ingrey et al. | 156/646 X |

*Primary Examiner*—William A. Powell
*Attorney, Agent, or Firm*—George S. Indig

[57] ABSTRACT

Integrated circuit fabrication, e.g., silicon LSI is expedited by plasma etching in any of a novel class of etchants. Appropriate plasma environments are produced by introduction of halide-halogen combinations as exemplified by $BCl_3$-$Cl_2$.

11 Claims, No Drawings

DEVICE FABRICATION BY PLASMA ETCHING

BACKGROUND OF THE INVENTION

A. Technical Field

Fine resolution device and circuits are fabricated by one or a series of steps each involving lithographic resolution followed by selective treatment of regions of a layer of initially continuous, homogeneous device material. Lithography is ordinarily carried out in "actinic" material which is subsequently developed to result in aperture-delineation. Such patterns serve to directly or indirectly mask material undergoing etching or other processing. Selective etching may be carried out by dry processing for example, by means of a species produced in a plasma to wet processing where particularly fine resolution is desired.

Such fabrication is used in production of Large Scale Integrated silicon circuitry. Use is contemplated as well for discrete devices, in other semiconductor technology, for integrated optical circuitry, for magnetic memories, etc.

B. History

Large Scale Integrated circuitry as well as other high resolution planar structures are generally fabricated through a series of levels. One procedure, common to construction of most such circuits involves first producing a masking layer within a continuous region of actinic material by selective exposure to radiation followed by solution development to selectively remove material which has been rendered either more or less soluble through irradiation. Such masking layers have served as discrete masks (sometimes with the additional step of replication of the pattern in an underlying layer of some more durable layer such as chromium).

This mask technology now in prevalent use in the fabrication of silicon integrated circuits has undergone considerable development to the present point at which design rules of a few microns are regularly attainable. Discret masks so used serve for secondary delineation of patterns in expendable photoresist layers which are developed to serve for actual device processing. Photoresist layers are removed at each processing level to permit fabrication at the next level.

It is generally believed that mask technology will be superceded by a maskless technology (direct processing) to produce finer resolution and higher device density. In accordance with such contemplated procedures, primary rather than secondary delineation will be in expendable resist layers tightly adherent to the device undergoing processing. Such resist layers may be true photoresists or may use short wavelength radiation.

Regardless of procedures—whether mask or maskless; regardless of involved technology, a procedure common to all such fabrication involves selective etching of continuous layers of device-functional material. To date, wet etching—for example by use of aqueous acid media—has found satisfactory use. As resolution needs become more stringent, inherent limitations become more significant. Liquid media reacting with polycrystalline or amorphous layers together result in isotropic etching. Resulting undercutting, (removal of material under the masking material) imposes a limit on spacing.

Increasing miniaturization has resulted in appreciation for advantages of dry processing. Etching by momentum transfer, for example by ion milling, imparts, directionality to material removal and eliminates undercutting. High accelerating fields resulting in energetic particle bombardment of surfaces being processed sometimes causes a new set of problems. Lattice damage at some levels of fabrication may even destroy the device.

At the other end of the spectrum, dry processing may depend upon plasma assisted reactions. Plasma etching, for example, is dependent upon removal primarily due to chemical reaction of material to be removed with plasma-produced etching species. As in momentum transfer processing, etched product may be easily removed—in this instance by system selection to result in vapor state reaction product. Plasma assisted etching, however, may be isotropic in behavior. Anisotropy may result from use of large plasma fields and low pressures but this may, in turn, produce intolerable lattice damage as well as rapid resist erosion. As in wet etching, imperfect end point detection complicated by unequal wafer-to-wafer etching may result not only in extreme undercutting, but also in etching of underlying layers. The latter is alleviated by etching systems with pronounced selectivity for material being etched relative to underlying material.

A variety of materials are encountered in LSI production. For present design rules oxide layers are satisfactorily plasma etched with mixtures of methane and oxygen. The same mixtures are applied to many other materials but selectivity is generally poor. Aluminum or aluminum-rich layers are etched by plasma species resulting from introduction of carbon tetrachloride. $CCl_4$, a liquid at room temperature, is difficult to monitor. Heating to increase volatility results in unwanted condensation in cool regions.

A recognized problem with $CCl_4$—unreliable initial etching has been solved by use of $BCl_3$ (see *J. Vac. Sci. Technol.*, 14, No. 1 p. 266 1977) A continuing problem in aluminum etching is poor discrimination—due to significant etching of $SiO_2$ as well as Si. A further problem, attributed to unwanted polymer formation, is evidenced by unwanted etching following exposure to the atmosphere. It is believed that difficulty removed polymer, reacts with atmospheric moisture to produce HCl which is responsible for continuing etching.

SUMMARY OF THE INVENTION

Plasma etching processes useful for aluminum-rich material are based on use of a specified category of etchant compositions. Mixtures of boron trichloride and diatomic chlorine are exemplary of material which under the influence of plasma discharge results in desirable etch behavior, e.g., (1) excellent discrimination for aluminum-rich material relative to resist materials as well as to encountered substrate materials (from 10:1 to 20:1 for aluminum over silicon or silicon oxide), (2) etch rates satisfactory for fine line device fabrication purposes (rates of up to 1000 Angstroms/min. are easily attainable), (3) rapid removal of normally encountered passivating layers (e.g., $Al_2O_3$), thereby permitting uniform initial etching, (4) system characteristics resulting in minimization of "loading" (loading is the dependence of etch time on integrated surface area to be etched), and (5) control of etch wall profiles thereby permitting straight vertical etching as defined by resist masking layers.

The inventive procedures are suitably applied to aluminum-rich alloys (e.g., Al, Al-Cu, and Al-Si) encountered in the fabrication of silicon Large Scale Integrated circuits as well as in discrete devices. Important embodiments of the invention are concerned with LSI fabrication as well as fabrication of similar circuitry in which larger device density is based on design rules at the micron and submicron level (Very LSI).

DETAILED DESCRIPTION

1. General

Inventive subject matter is largely in terms of device or circuit fabrication. While not necessarily so limited, fabrication steps of concern generally involve dry etching of aluminum-containing material. Aspects of the invention are concerned with etch rates, discrimination, profile, etc. Such considerations are in turn dependent upon composition as well as processing conditions and such considerations are the subject of succeeding sections.

2. Terminology

Plasma Assisted Etching

This terminology, not in general use at this time, is intended to encompass the various procedures in which etching is primarily due to chemical reaction with etchant within the plasma. Included processes necessarily contemplate chemical reaction to result in a reaction product species which is itself gaseous or which through further reaction becomes gaseous. Included procedures are "plasma etching" (in which the article to be etched is on the nondriven electrode), "reactive ion etching" in which the article is on the driven electrode and in which the reduced size of that electrode results in some intended field concentration, "reactive sputter etching," etc. Not contemplated are processes in which removal is largely due to momentum transfer rather than chemical reaction. Accordingly, it is not intended to include ion milling nor procedures generally included within the term "sputter etching."

Loading

Dependence of etch rate on surface area being etched. Since the effect is never totally eliminated, at least in principle, it is convenient to assign a numerical limit. For these purposes, a 10 percent increase in required etch time with a ten fold increase in surface area to be etched defines the onset of loading.

Aluminum-rich

As the term connotes, these are materials which are at least 50 percent aluminum. Additionally, however, it is required that materials within this category showed the etching properties associated with elemental aluminum. Accordingly, whether containing unintended impurities or intended alloying materials, aluminum-rich materials as contemplated may form passivating surfaces upon exposure to atmospheres commonly encountered and should otherwise show general etching behavior characteristic of the elemental material. Certain alloying ingredients such as silicon and copper, both commonly included in LSI fabrication, are likely to be present in small amounts—of the order of a few percent. Other ingredients which are themselves similar to aluminum, may be contained in larger amounts with the resulting composition still benefiting by use of the inventive procedures.

Etchant Species

That species to which material removal is generally attributed. Investigation clearly indicates the primary etchant species to exist only in the plasma environment. Other evidence suggests the primary etchant species to exist in the plasma either at the surface undergoing treatment, or at a position separate therefrom. Conclusions are derived on the basis of detection from spectroscopic analysis. Identification of etchant species in this description is largely expository and not otherwise limiting. On this basis, etching is generally ascribed to atomic halogen-generally atomic chlorine. Except where otherwise specified, the term does not include relatively "inert" ingredients such as components serving primarily as and/or carrier diluent.

Etch Profile

Refers to the wall shape and position during and after etching with position being defined as relative to the defining masking edge. A variety of terms are used to characterize profile.

Straight wall

Is the straight vertical wall (vertical relative to the plane of the surface being etched) which is in position approximately coincident with the edge of the defining masking layer. In general, it is assumed that the masking edge has not eroded appreciably so that the edge of concern is that prior to etching. Straight etch walls inherently require anisotropic etching.

Undercut

Refers to an etch wall produced by etching underneath resist material regardless of wall configuration (i.e., by "undercutting").

Negative Undercut

Refers to the complementary condition in which area bared during etching decreases in size as etching depth increases so that etch walls lie, at least partly, within unmasked area.

Isotropic refers to etching in which material removal is truly nondirectional. True isotropic etching should result in an etched feature which is of decreasing lateral dimension with depth. Penetration beneath the protecting resist edge should equal etching depth at each level.

Anisotropy (anisotropic etch, anisotropic process, etc.) The term is used to differentiate from "isotropy" i.e., to suggest any degree of directionality representing a departure from isotropic. For convenience it is considered that the departure must be at least 10 percent expressed as a percent of the entirety of a linear dimension in the desired etching direction. The term *truly anisotropic* refers to the generally ideal behavior resulting in a straight etch wall.

3. Etchant Precursor Composition

Composition is discussed in terms of the preferred mixture of $BCl_3$ and $Cl_2$. The principle of operation however, is sufficiently generic to include a number of alternatives. So for example, chloride or chlorine may be replaced by other halogens and boron may be replaced by other cations. However, such substitutions may give rise to complications which, while remedial, may not be justifiable. So for example, while bromine or bromide may be used, $AlBr_3$ reaction product is not volatile (unlike $AlCl_3$) and removal is complicated possibly giving rise to use of gaseous reactant or, inert carrier or other means for removing normally nonvolatile $Al_2Br_3$. Iodine, less reactive than bromine, is also non volatile. Fluorine results in passivation of aluminum-rich surface and should not be included as the sole diatomic gas.

Composition as presented in terms of the two essential precursor ingredients of the preferred embodiment without regard to carrier, diluent, etc., centers about 5 volume percent $Cl_2$. This center composition is found quite desirable from the standpoint of etch rate and selectivity. An overall range in the same terms of from 0.5 percent to 20 percent and higher $Cl_2$ and preferably from 0.5 to 8 defines a range including compositions which suit most contemplated needs. Increasing amounts of chlorine above the preferred maximum value, result in increasing etch rate, but are generally accompanied by a tendency toward undercutting. The tendency toward undercutting may be lessened by increasing power and/or decreasing pressure, but this may give rise to radiation induced lattice defects. Chlorine content below 0.5 percent by volume results in decreasing etch rate—well below 1000 Angstroms/min.—for given conditions. Such lesser chlorine content may be desired for layer thicknesses appreciably at or below one micron.

Likely unintentional ingredients which may be tolerable include oxygen to 5 percent (larger amounts result in significant resist attack) water below about below 1 percent, and carbon dioxide up to several percent. Other intentional ingredients may be present. Certain of these may serve as simple diluent or carrier. Others may serve to control discharge conditions. Examples of the former include $N_2$, He and Ar. While plasmas are observed to be extremely stable, use of very high power could give rise to confinement which may be alleviated through the inclusion.

4. Etchant Composition

Consistent with previous sections, discussion is in terms of the exemplary mixture $BCl_3$-$Cl_2$. End product analysis as well as other observations lead to the conclusion that the primary etchant species is atomic chlorine. $BCl_3$ or plasma derivative of $BCl_3$ is believed to serve as a recombinant thereby shortening inherent etchant species lifetime. Consistent with "The Loading Effect in Plasma Etching," *J. of the Electrochemical Society*, 124, No. 8, p. 1262 (8/77) shortened inherent etchant lifetime lessens loading effect. Preferred composition is discussed with a view to system characteristics as applied to fabrication of structures where layers to be etched are of thicknesses in the micron and submicron range. Again, considering the preferred $BCl_3$-$Cl_2$ mixture, all compositions otherwise suitable share the prime attribute of good discrimination relative to resist. Extremes in composition, as well as intermediate compositions result in such slight resist attack as to be generally undetectable. Similarly, discrimination with respect to underlying material, (e.g., elemental silicon-containing as well as chemically combined silicon) is good for the entire range of compositions considered.

Critical parameters considered in determining parameter ranges are (1) etch rate, and (2) etch profile. Although some fabrication procedures may tolerate isotropic profiles, design rules of the order of a very few microns and below, generally give rise to a desire for reduced undercutting. A generally preferred parameter range may be set on the basis of an etch rate ratio in a direction parallel to the surface relative to normal to the surface undergoing etching. For many purposes a suitable ratio may be 1:3 or better with a natural preference for ideal anisotropy equivalent to a ratio approaching zero.

For parameter ranges of discussion etch rate is largely dependent upon pressure within the plasma and power with etch rate decreasing as either of these parameters decreases. For many purposes, an etch rate of about 400 Angstroms/min. is tolerable. This rate is based on the assumption that layer thicknesses may be of the order of one or a few thousand Angstroms so the total etch time is a few minutes.

On the basis of the above assumptions, extreme pressure and power limits may be set as 0.05 torr–0.6 torr and 0.035 watts/$cm^2$–0.7 watts/$cm^2$, respectively. These parameters are in turn interrelated with chlorine content.

It has been found that as etch rate decreases (as pressure or power approaches the minimum indicated, the permitted chlorine range increases). As a corollary as pressure increases, the permitted maximum chlorine content decreases. Chlorine content is generally within a range of from about 0.5 percent to about 8 percent. A maximum chlorine content for ideal anisotropy is about 6 percent. All chlorine content percentages are based on total $BCl_3$-$Cl_2$ mixture. Chlorine content also enters into considerations of etch rate with increasing chlorine resulting in increasing rate. The minimum of 0.1 percent is also the absolute minimum from the rate standpoint.

It is now possible to specify interrelated parameters to result in desired anisotropy as well as etch rate. From the anisotropy standpoint (from an anisotropy ratio, at least as good as 1:3) chlorine content is from 0.1 percent (suitable from the anisotropy standpoint for any pressure-power value within the range indicated) to a maximum chlorine concentration of about 8 percent for minimum values of pressure and accompanying power and pressure accompany a minimum power (0.05 torr–0.28 watts/$cm^2$ to 0.2 torr–0.035 watts/$cm^2$) to a maximum of about 0.5 percent for maximum pressure-power (0.6 torr–0.7 watts/$cm^2$).

Parameter constraints for preferred embodiments arise from a desire for an etch rate of at least about 100 Angstroms/min., as well as etch profile. It is found that the latter imposes a limit of about 800–1000 Angstroms/min. with further increase in etch rate resulting in a tendency toward near isotropy.

The etch rate limits correspond generally with pressure-power ranges of 0.1 torr–0.1 watts/$cm^2$ to 0.5 torr–0.5 watts/$cm^2$. Chlorine content corresponding to these two limits are from 0.5 volume percent to 7 volume percent corresponding with the minimum power-pressure pair to 0.5 volume percent–2 volume percent corresponding with the maximum.

Experimental work to date permits profile control—in fact permits straight walls—for lower chlorine content. Recombination is concluded to be particularly effective at or in the vicinity of walls. The effect is described in copending application Ser. No. 929,549, filed July 31, 1978 (Harshbarger et al).

While description is largely in terms of the $BCl_3$-$Cl_2$ preferred embodiment more general description is in terms of introduction of materials such as result in atomic halogen (e.g., Cl) together with a halide recombinant (e.g., a chloride of boron).

5. Material to be Etched

The invention is concerned largely with etching of aluminum-rich material. Contemplated materials are well known to workers in the art as those which show the general properties of aluminum during etching. For these purposes, the inventive processes are designed for and claims are directed to fabrication involving etching of alloys which are at least 50 at percent Al. In fact such large amounts of alloying ingredients are permitted only when there is close chemical and physical resemblance.

For LSI fabrication, both in silicon technology and elsewhere, a significant contemplated purpose served by aluminum-rich material is simply that of electrical conductor. Contemplated alloying ingredients are in minor amounts and are generally concerned with characteristics unrelated to conductivity. So for example, it is known that small amounts of silicon, e.g., up to 5 percent—likely below 10 percent—may be included for aluminum circuitry directly in contact with silicon-rich material. The purpose here is to presaturate the aluminum (generally about Al-2 percent Si) to prevent dissolution and consequent ("punch-through") of underlying Si-rich layers. Admixture of copper generally at a nominal level of about 4 percent by weight is useful in the fabrication of garnet bubble circuitry. Copper serves to reduce electromigration which, if permitted, may cause deterioration of garnet magnetic properties.

6. Other Compositional Considerations

An inportant attribute of etchant systems of the invention is composition discrimination. Under usual conditions, the etch rate ratio of etchants of the invention for aluminum-rich alloys relative to generally encountered underlying surfaces is likely to be in the range of 10:1 to 20:1. Such underlying surfaces include oxide of silicon however produced, as well as silicon, whether mono or polycrystalline. Discrimination for aluminum-rich material relative to Novolac type resists is also good—at least 10:1. Based on other experimental experience, etchant attack on other processing resists (as distinguished from mask making resists) should be adequate. It appears that the only underlying surface materials which may present a problem are those which resemble aluminum, i.e., alkaline earth metals and other elements or related alloys of atomic members substantially below that of silicon. Even under circumstances where discrimination is not large, other attributes of the inventive etchant systems may recommend their use.

7. Processing Conditions

Procedures in accordance with the invention may be carried out in any otherwise suitable reactor. Preference for flow patterns which result in uniform etching are, of course desirable and experiments upon which this disclosure is based were generally carried out on such apparatus. Apparatus, in this instance of radial flow design is described in A. R. Reinberg in "Etching for Pattern Definition" (H. G. Hughes and M. J. Rand, eds.), The Electrochemical Society, Inc. Princeton, NJ, 1976; and R. G. Poulsen, *J. Vac. Sci. Technol.*, 14, 266, (1977).

Parallel plate systems comprise pairs of plates contained in a suitable vacuum enclosure. Power commonly in the rf range (e.g., 13.56 megahertz) is applied to the driven plate to initiate and sustain a discharge between the plates, the nondriven of which is ordinarily held at ground potential. It has been indicated that "plasma etching" as here contemplated may include a variety of procedures commonly designated otherwise. The only requirement for these purposes is primary removal of surface material to be etched through chemical reaction rather than momentum exchange. Nomenclature variations may arise, for example, in accordance with relative size of electrodes, as well as, placement of the wafers (either on the driven or nondriven electrode/s). In the procedure commonly known as reactive ion etching, the driven electrode is substantially smaller than the counter electrode and the material to be etched is placed on the driven electrode. In the case of the procedure ordinarily referred to as plasma etching the electrodes are more nearly symmetric and the material to be etched is placed on the nondriven electrode. Such apparatus variations, as well as variation among the conditions: power, pressure, etc. qualify in accordance with the teaching providing the fundamental requirement (primary removal by chemical reaction . . . ) is met.

Parameters subject to control in these reactors are: etch gas composition, pressure, inlet flow rate, power, interelectrode spacing and substrate temperature. Typical ranges for these parameters are: pressure—0.1–1 torr; flow rate—10–500 SCCM; power—100–3000 watts; electrode spacing—5–50 millimeters; substrate temperature—25–250 degrees C.

8. Examples

Apparatus

Experiments were conducted on apparatus of radial flow design as described above. Plate diameter was 17" with a plate spacing of 1". Both electrodes are hollow to provide for temperature control generally for water heating or cooling. Specimens to be etched are supported on the lower electrode which is electrically grounded to the reactor.

The reactor is provided with a liquid nitrogen cold trap intermediate the reactor and the vacuum pump to minimize corrosion of the pump. The trap also acts to condense any water vapor and effectively increases the pumping speed relative to water.

Loading

Except where noted experiments were conducted with but a single 3" wafer supporting a masked layer of aluminum-rich material, the layer having a thickness of from one half to one micron over $SiO_2$. While the examples utilized steam oxidized silicon, other experiments used other forms of silicon oxide with no perceptible change in discrimination.

Procedure

With the chamber still closed, water at a temperature of about 80 degrees C. was passed through both electrodes for a period of a few minutes (to minimize the likeihood of water condensation during loading). The chamber was then opened and the wafer placed on the bottom electrode; the chamber was closed and the pump set in operation. When a pressure of about 30 microns was attained, the hot water was replaced by flowing cold water at a temperature of about 25 degrees C. Pumping was continued to a base pressure of a few microns, and the precursor etchant gases were introduced. Introduction of gases was varied between limits such as to result in observed pressures of 100–350 microns (which for the apparatus and conditions, noted was equivalent to flow rate limits of from 37 to 180 SCCM—standard cubic centimeters/min.—these units are standardized for flow as measured at one atmosphere and 25 degrees C.). The gaseous mixture was ignited to produce a plasma with discharge at an rf frequency of 13.56 megahertz and power of 400–600 watts (equivalent to 0.25 to 0.4 watts per square centimeter). Etch rates were determined to be 300–1000 Angstroms per minute. Endpoint was generally detected by an increase in pressure (due to the larger volume of unreacted etchant). In other experiments, endpoint was determined by emission spectroscopy—by observation of disappearance of the $AlCl_3$ band. Conditions were controlled to result in etch time within the range of from 5-20 minutes.

EXAMPLE 1

An aluminum 4 percent copper coating of a thickness of 4,000 Angstroms was etched under the following conditions:
Power—600 watts
Pressure—0.1 torr
Precursor gas mixture
  5 volume percent $Cl_2$
  95 percent $BCl_3$
Flow rate—39 SCCM
Etch rate—300 Angstroms/min.
Profile—Ideal anisotropic flat vertical etch wall approximately corresponding with position of initial resist edge.

EXAMPLE 2

An aluminum—0.5 percent Cu, 0.75 percent Si, alloy layer of a thickness of one micron was etched under the following conditions:
Power—400 watts
Pressure—0.35 torr
Precursor gas mixture
  2 percent $Cl_2$
  98 percent $BCl_3$
Flow rate—189 SCCM
Etch rate—1000 Angstroms/min.
Profile—Ideal anisotropic flat vertical etch wall approximately corresponding with position of initial resist edge.

EXAMPLE 3

Aluminum 2 percent Si, alloy fiber of 7000 Angstroms thickness was etched as follows:
Power—600 watts
Pressure—0.1 torr
Precursor gas mixture
  5 volume percent $Cl_2$
  95 percent $BCl_3$
Flow rate—39 SCCM
Etch rate—300 Angsrom/min.
Profile—Ideal anisotropic flat vertical etch wall approximately corresponding with position of initial resist edge.

The following examples were conducted on the alloy of example 2 (0.5 Cu, 0.75 Si, remainder Al). Conditions were as set forth in example 2. Gas composition was varied as indicated.

| Example | Volume Percent $Cl_2$ | Etch Rate (A/min) | Profile (expressed as lateral etch depth/ vertical etch depth) |
|---|---|---|---|
| 4 | 1 | 520 | anisotropic-undercut 1:2 |
| 5 | 2 | 800 | ideal anisotropic 0:1 |
| 6 | 3 | 930 | anisotropic-undercut 1:3 |
| 7 | 4 | 1000 | isotropic |
| 8 | 5 | 1380 | isotropic 1:1 |
| 9 | 6 | 1500 | isotropic 1:1 |
| 10 | 10 | ~1500 | isotropic 1:1 |
| 11 | 20 | ~1500 | isotropic 1:1 |

The following examples were all conducted with introduced chlorine at 6 volume percent at a pressure of 160 microns (0.16 torr) with an aluminum-rich alloy composition as noted in example 2. The varied parameter was power with noted etch rate and profile resulting.

| Example | Power (watts) | Etch Rate (A/min.) | Profile (expressed as lateral etch depth/ vertical etch depth) |
|---|---|---|---|
| 12 | 400 | 390 | ideal anisotropic 0:1 |
| 13 | 500 | 460 | anisotropic-undercut 1:6 |
| 14 | 600 | 580 | isotropic 1:1 |

The following set of examples were all based on 10 volume percent chlorine and 400 watt power with varying pressure:

| Example | Pressure (Microns) | Etch Rate (A/Min.) | Profile |
|---|---|---|---|
| 15 | 350 | 1400 | Anisotropic |
| 16 | 200 | 950 | Anisotropic |
| 17 | 100 | 417 | Anisotropic |

Resist attack in each of examples 15, 16, 17 was acceptable for contemplated purposes.

The following set of examples were conducted at a fixed chlorine content of 5 volume percent at a fixed pressure of 0.1 torr and at varying power.

| Example | Pressure (Microns) | Etch Rate (A/min.) | Profile |
|---|---|---|---|
| 18 | 400 | 320 | Anisotropic |
| 19 | 500 | 380 | Anisotropic |
| 20 | 600 | 520 | Anistropic |

Resist attach in each of examples 18–20 was acceptable for most demanding contemplated use.

Conditions of example 1 were followed with helium introduced to result in a pressure of approximately 200 microns (approximately equal to 50 volume percent helium based on the total introduced gaseous mixture) etching was isotropic. Etch rate was increased with little effect on other observed properties.

We claim:

1. Process for fabrication of an article comprising at least one operation during which the article undergoing fabrication comprises a surface of material to be etched, wherein the said article is etched within a plasma environment contained within an apparatus, the plasma resulting from imposition of an electrical field across a gaseous mixture between two electrodes, the material to be etched comprising an elemental aluminum-rich composition, etching being primarily due to chemical reaction with the said material to be etched characterized in that the said gaseous mixture comprises a mixture of $BCl_3$ and $Cl_2$ which in the said plasma results in the said chemical reaction in which the $Cl_2$ content in the said gaseous mixture is from 0.1 volume percent to 20 volume percent expressed as a percent of the total content of $BCl_3$ plus $Cl_2$ and further in which pressure and power within the plasma environment are maintained, respectively, within the limits of from 0.05 torr to 1 torr and from 0.035 watts/cm$^2$ 0.7 watts/cm$^2$.

2. Process of claim 1 in which the $Cl_2$ content on the same basis is from 0.5 volume percent to 8 volume percent.

3. Process of claim 1 in which the said aluminum-rich material contains at least 50 at. percent aluminum.

4. Process of claim 1 in which the said aluminum-rich material contains at least 75 at. percent aluminum.

5. Process of claim 4 in which the said aluminum-rich surface consists essentially of elemental aluminum.

6. Process of claim 4 in which the said aluminum-rich surface consists essentially of an alloy of aluminum and at least one element selected from the group consisting of silicon and copper.

7. Process of claim 6 in which the said aluminum-rich material consists essentially of from zero to 5 percent silicon, zero to 5 percent copper, remainder aluminum.

8. Process of claims 1, 2, 3, 4, 5, 6, or 7 in which etching is limited to selected regions of the said surface.

9. Process of claim 8 in which the said selected regions correspond with regions bared through apertures of an overlying masking layer.

10. Process of claim 9 in which the said masking layer consists essentially of an organic resist masking layer.

11. Process of claim 1 in which minimum pressure-power values lie between 0.5 torr–0.28 watts/cm$^2$ and 0.2 torr–0.035 watts/cm$^2$.

* * * * *